United States Patent [19]
Mayshar

[11] 4,186,274
[45] Jan. 29, 1980

[54] SOUND SYSTEM CONTROL

[75] Inventor: Andrew G. Mayshar, Shrewsbury, Mass.

[73] Assignee: Bose Corporation, Framingham, Mass.

[21] Appl. No.: 917,874

[22] Filed: Jun. 22, 1978

[51] Int. Cl.² .............................................. H03G 9/00
[52] U.S. Cl. .................................. 179/1 D; 179/1 N; 333/28 T; 179/1 M
[58] Field of Search ............. 179/1 D, 1 N, 1 B, 1 M, 179/1 R; 361/331, 334, 380; 84/1.01, 1.19, 1.24; 325/399, 427; 330/65; 333/18, 28 R, 28 T

[56] References Cited
U.S. PATENT DOCUMENTS

| | | | |
|---|---|---|---|
| 3,623,241 | 11/1971 | Becker et al. | 179/1 N |
| 4,021,613 | 5/1977 | Kennedy | 179/1 D |
| 4,064,364 | 12/1977 | Veale | 179/1 B |
| 4,109,106 | 8/1978 | Voss | 179/1 N |

OTHER PUBLICATIONS

Best Co. Catalog, "8-Track Tape Players", p. 341, 1978.

Primary Examiner—Kathleen H. Claffy
Assistant Examiner—E. S. Kemeny
Attorney, Agent, or Firm—Charles Hieken

[57] ABSTRACT

Control panel arrangement for an audio equalizer features grouped horizontal and vertical slider controls for convenience in adjusting channel gain, bandwidth and frequency response.

5 Claims, 12 Drawing Figures

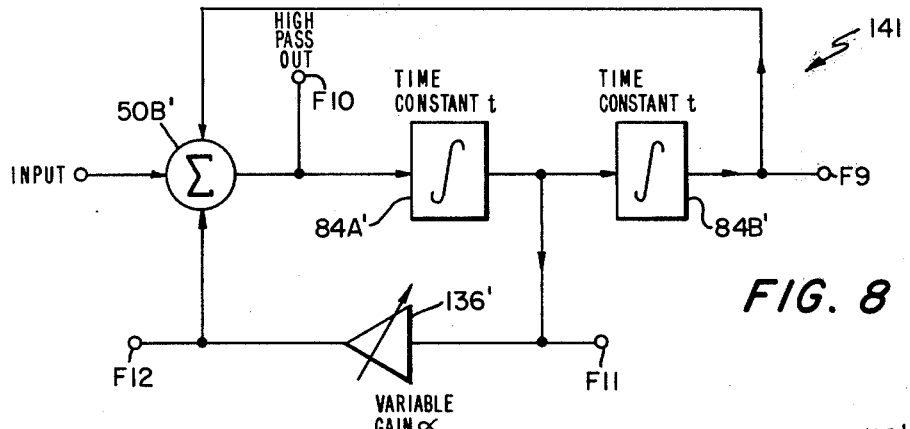
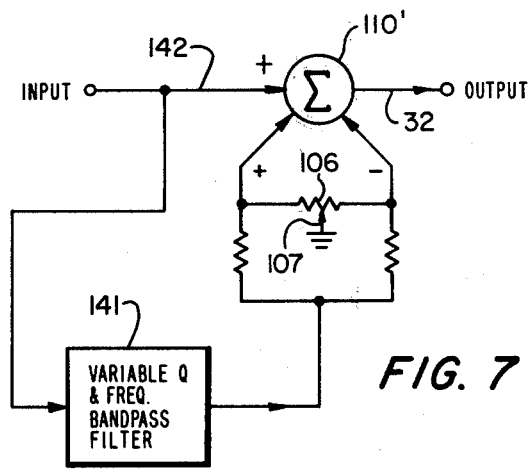
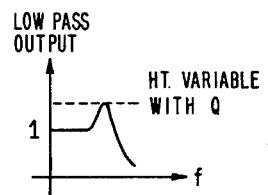
FIG. 9
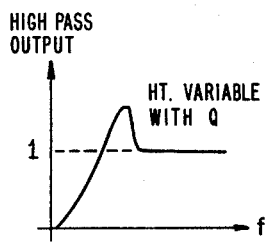
FIG. 10
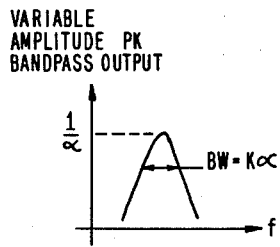
FIG. 11
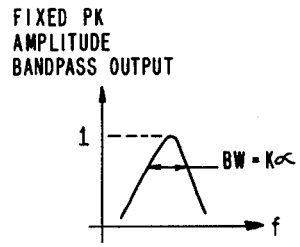
FIG. 12

SOUND SYSTEM CONTROL

BACKGROUND OF THE INVENTION

The present invention relates in general to parametric equalizing and more particularly concerns a novel parametric sound equalizer characterized by an especially convenient arrangement of controls for enabling the performer to more readily control the desired degree of frequency response alteration and balance in the different frequency ranges.

Modern electronic sound amplification systems frequently have a parametric equalizer with a multiplicity of controls for modifying the sound output of the system. Included in these are controls for varying the gain, bandwidth and frequency response in different frequency ranges. These controls may be used to modify the output of the system by the performer to provide desired sound characteristics.

The conventional arrangement of parametric equalizer controls makes it difficult for a technically unskilled performer to achieve desired results during a musical performance. Or the controls may be used improperly, and detract from the performance.

Accordingly, it is an object of the invention to provide an arrangement of controls for frequency and amplitude variation of the output of a sound system that overcomes one or more of these problems.

It is another object of the invention to provide a convenient, easy to use, and comprehensible arrangement of controls for the amplitude and frequency modification of the output of a sound system.

SUMMARY OF THE INVENTION

According to the invention, there is provided in a sound amplification system including amplification means for varying the sound amplification for different selected contiguous audio frequency ranges, each amplification means being effective over one of the frequency ranges, and including frequency response control means for selectively controlling the frequency response within the frequency range over which the amplification means will be effective, an arrangement of controls for the amplification means and the frequency response control means comprising linear controls arranged in a line in order of the frequency range whose response is controlled, and amplitude controls for the amplification means, each of the controls being located adjacent the linear frequency response control corresponding to the frequency range over which the amplitude control is effective.

According to other features of the invention the controls for the amplification means are linear controls; the linear controls for the frequency response control are movable over substantially contiguous linear paths arranged in the order of frequency range controlled.

In still other features of the invention, the linear controls for amplification means are arranged perpendicularly to the linear controls for frequency response control means for the frequency range over which the control for amplification means is effective; and there is included a bandwidth control means for varying the bandwidth of the amplification means associated with one of the frequency response control means, the bandwidth control means being located near the associated amplification control means.

Also there may be included simple graphic indicia of the frequency range controlled by each said linear control for the frequency response control means, the indicia being located near the linear control; and simple graphic indicia of bandwidth variation, located adjacent the bandwidth control means.

Numerous other features, objects and advantages of the invention will become apparent from the following specification when read in connection with the accompanying drawings in which:

BRIEF DESCRIPTION OF THE DRAWING

FIG. 7 is a combined block-schematic circuit diagram illustrating the logical arrangement of the means for combining the different filtered signals;

FIG. 8 is a block diagram illustrating the logical arrangement of a variable Q bandpass filter according to the invention;

FIGS. 9–12 show frequency response characteristics at terminals F9–F12, respectively, in the system of FIG. 8.

DETAILED DESCRIPTION OF PREFERRED EMBODIMENTS

Figure 1:
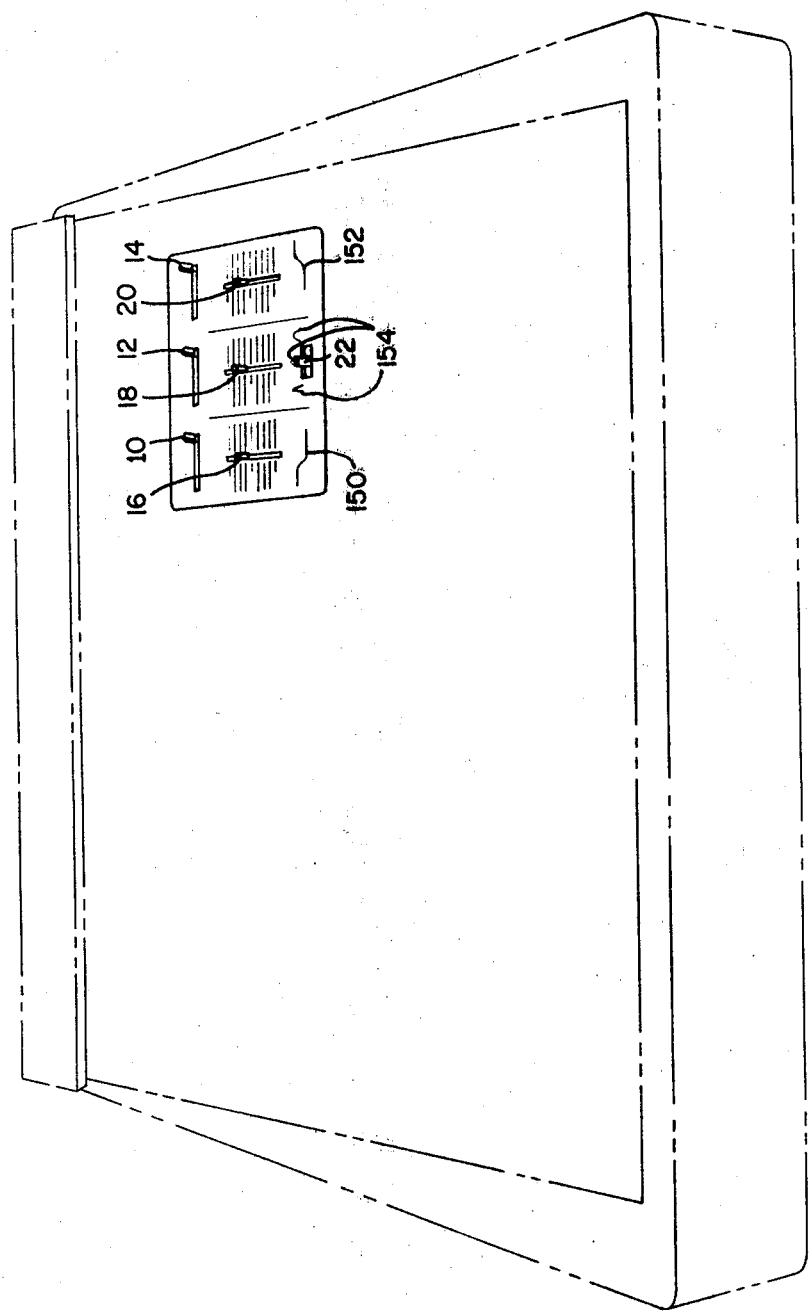
FIG. 1 is a perspective view of a portable sound system in outline having the controls for a parametric equalizer according to the invention.

With reference now to the drawing and more particularly FIG. 1 thereof, there is shown a perspective view of a portable sound amplification system in outline having a parametric equalizer with controls according to the invention. These controls include three linear frequency response slide controls 10, 12 and 14, for low, middle and high frequency ranges, respectively. The slides are attached to the arms of potentiometers (to be described below) that comprise means for controlling the frequency response within the respective frequency ranges. The controls also include linear gain or amplitude controls 16, 18, and 20 whose slides are attached to the arms of the potentiometers (also to be described below) that vary the gain in the channels for the frequency ranges associated with the respective adjacent linear frequency response controls 10, 12, and 14. A three position switch 22 is a Q selector, varying the Q or bandwidth of the middle frequency channel associated with frequency response control 12 and gain control 18.

Figure 2:
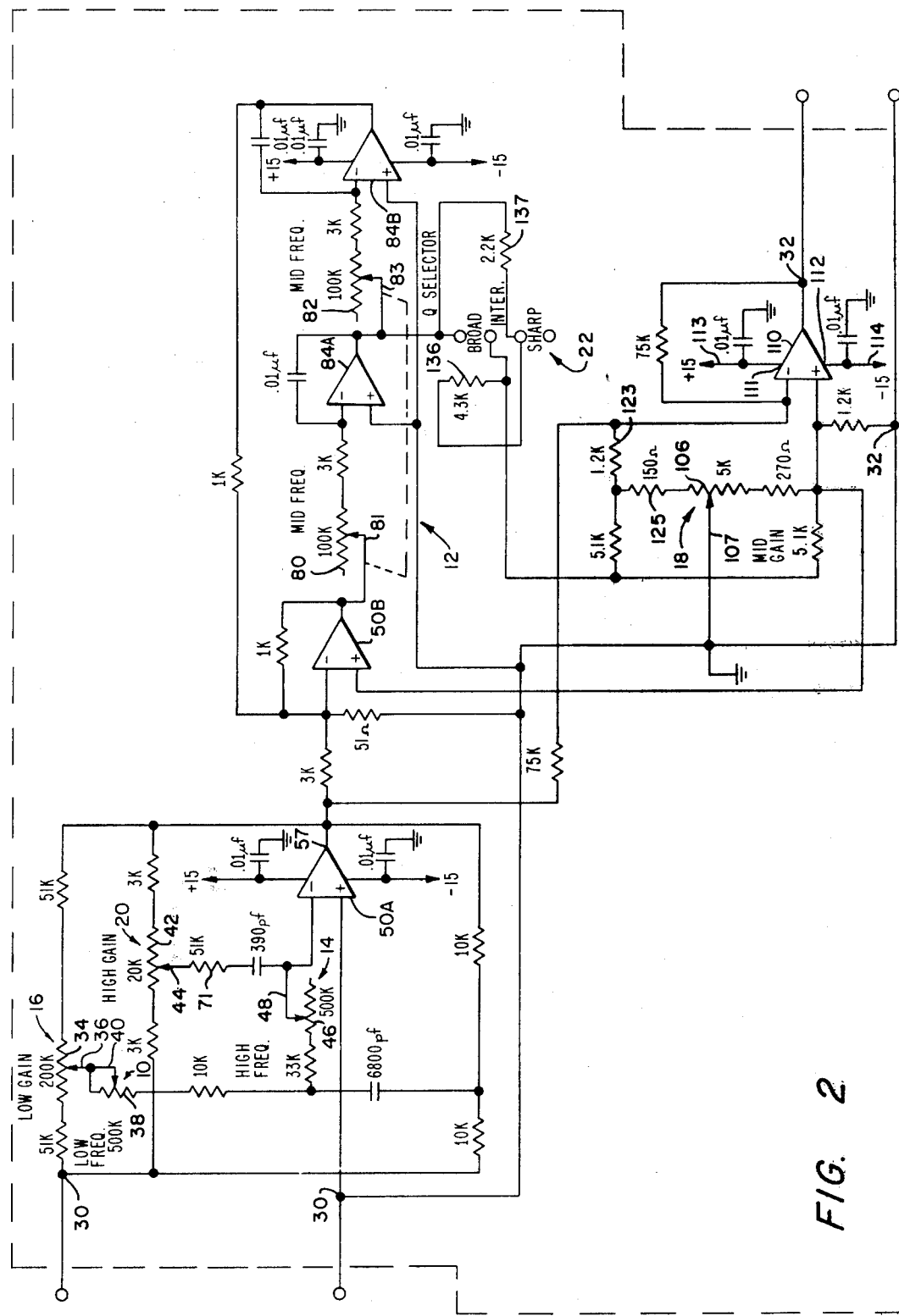
FIG. 2 is a schematic diagram of the parametric equalizer circuit.

Referring to FIG. 2, there is shown a circuit diagram for an exemplary parametric equalizer incorporating controls according to the invention. The output of a preamplifier of the sound system is provided to terminals 30. The output of the parametric equalizer circuit is available at terminals 32.

The circuit includes bass or low frequency amplitude control 16 comprising potentiometer 34 with potentiometer arm 36 and bass or low frequency response control 10 comprising potentiometer 38 with potentiometer arm 40. There is also a treble or high frequency amplitude control 20 comprising potentiometer 42, with potentiometer arm 44, and a treble or high frequency response control 14 comprising potentiometer 46 with potentiometer arm 48.

Differential amplifiers 50A and associated circuitry comprise the low or bass and high or treble frequency selective transmission channels and delivers its output for transmission through the middle frequency selective transmission channel comprising differential amplifiers 50B, 84A and 84B and associated circuitry with differential amplifier 110 providing the signals from all three channels with frequency response and relative gains appropriately controlled to output terminals 32.

The middle frequency selective transmission channel includes middle frequency response control 12 comprising ganged potentiometers 80 and 82 having potentiometer arms 81 and 83, middle gain or amplitude control 18 comprising potentiometer 106 with arm 107 and Q selector 22 comprising a single-pole triple-throw switch for effecting sharp, intermediate and broad bandwidths when the respective contact pairs are bridged by the switch slide (not shown) to short resistors 136 and 137 in the broad position, short only resistor 136 in the intermediate position and allow the series combination of resistors 136 and 137 to be connected at the output of differential amplifier 84 in the sharp position. While a three position switch is shown, the Q control could be continuously adjustable by using a potentiometer. Middle frequency gain control 18 comprises potentiometer 106 having arm 107.

Having briefly described the physical arrangement of the circuitry, its principles of operation will be discussed. An important feature of the circuitry is the flexibility of adjustment with relatively few controls that are simple potentiometer adjustments, only one of which involves ganging potentiometers.

The circuitry associated with differential amplifier 50A allows adjustment of bass and treble half-power frequencies with controls 10 and 14 while independently adjusting the gains in the respective channels with controls 16 and 20 and transmitting the output signal to a bandpass filter comprising differential amplifiers 50B, 84A and 84B. There is overall feedback from the output of differential amplifier 84B to the − input of differential amplifier 50B. There is damping feedback from the output of differential amplifier 84A to the + input of differential amplifier 50B so arranged that the amplitude of the signal delivered to the ends of midgain potentiometer 106 is independent of the Q that is controlled by the amount of feedback to the + input of differential amplifier 50B. Increasing the resistance in this path decreases the feedback and sharpens the Q (narrows the bandwidth) without affecting the amplitude.

Differential amplifier 110 combines the signals provided by differential amplifier 50A on the − input with the signal provided on the + and − inputs from the bandpass amplifier to introduce a dip or bump in the overall response between terminals 30 and 32 in the middle frequency range depending upon the setting of the arm 107 of potentiometer 106.

Figure 3:
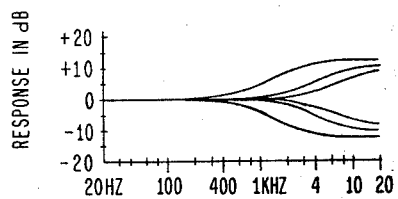
FIG. 3 is a graph showing the effect of the parametric equalizer over the high frequency range.

The effect of the parametric equalizer circuit of FIG. 2 is shown by the graphs of FIGS. 3 through 6. FIG. 3 shows how up to 12 decibels of cut or boost in sound amplitude can be given by manipulation of potentiometer arm 44 of high frequency amplitude potentiometer 42 to sound in the high frequency range. It also shows how manipulation of potentiometer arm 48 of high frequency band selection potentiometer 46 can shift the hinge point of the sound amplification effect between 2 kHz and 14 kHz for the circuit shown.

Figure 4:
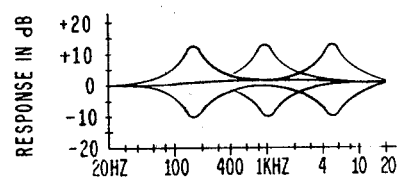
FIG. 4 is a graph showing the effect of the parametric equalizer over the middle frequency range.

FIG. 4 shows how the same amount of cut or boost (12 decibels) can be given by manipulation of potentiometer arm 107 of middle frequency amplitude potentiometer 106 to sound in the middle frequency range. It also shows how manipulation of ganged potentiometer arms 81 and 83 of middle frequency band selection potentiometers 80 and 82 can shift the center point of the sound amplification effect between 200 Hz and 6 kHz.

Figure 5:
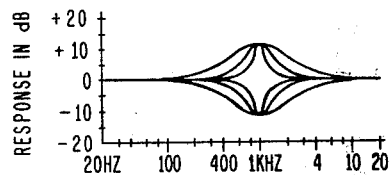
FIG. 5 is a graph showing the effect of a Q selector on the middle frequency bandwidth.

FIG. 5 shows the effect of three-position switch 127 as a bandwidth selector. The three positions of switch 127 select three different bandwidths about the center point selected by the middle frequency band selection potentiometer arms 81 and 83, as shown in FIG. 4.

Figure 6:
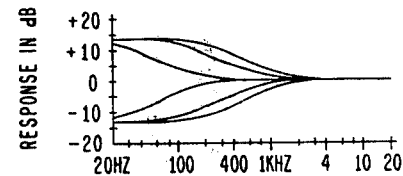
FIG. 6 is a graph showing the effect of the parametric equalizer over the low frequency range.

FIG. 6 shows how up to 12 decibels of cut or boost in sound amplitude can be given sound in the low frequency range by manipulation of potentiometer arm 36 of low frequency amplitude potentiometer 34. It also shows how manipulation of potentiometer arm 40 of low frequency band selection potentiometer 38 can shift the hinge point of the sound amplification effect between 50 Hz and 600 Hz.

The principles of operation will be better understood from a consideration of FIGS. 7–12. Referring to FIG. 7, there is shown a combined block-schematic circuit diagram of the portion of FIG. 2 which combines the signals to produce the overall response. Combining circuit 110′ receives one signal on + input 142 that is also delivered to the input of variable Q and frequency bandpass filter 141 comprising amplifiers 50B, 84A and 84B. The output of variable Q and frequency bandpass filter 141 is delivered to other + and − inputs of summing circuit 110′ to provide a signal that is either added to or subtracted from the signal on input 142 depending upon the position of grounded potentiometer arm 107 of potentiometer 106. In the middle position the signals effectively cancel. With arm 107 closer to the + and − inputs, respectively, the output of filter 141 is added to and subtracted from, respectively, the signal on input 142 to provide the equalized signal on output line 32 having the selected equalization characteristic.

Referring to FIG. 8, there is shown a block diagram illustrating the logical arrangement of the circuitry for providing a frequency response of fixed peak amplitude out and variable bandpass. The system of FIG. 8 fundamentally comprises a conventional state variable filter that has available a high pass output at terminal F10, a low pass output at terminal F9 and a bandpass output at terminal F11, the amplitudes of the outputs being variable as a function of Q as represented in FIGS. 9–11. By taking the output at the input of combining means 50B′ following variable gain network 136′, the amplitude of the response between input 57 and terminal F12 remains substantially constant as the gain of variable gain network 136′ is varied to vary the bandpass; and hence, the Q, as indicated in FIG. 12.

The result of these arrangements is that selected low pass and high pass transmission paths are combined with a bandpass transmission path in a convenient manner that allows individual control of the various gains, hinge frequencies, bandpass center frequency and bandwidth or Q, allowing selective insertion of a bandpass peak or dip.

Referring now to FIG. 1, it can be seen that the three linear controls 10, 12 and 13 are attached to the potentiometer arms 40, 81 and 83, and 48, of the low frequency band selection middle frequency band selection, and high frequency band selection potentiometers 38, 80 and 82, and 46, respectively. The potentiometers are linear, that is, the movement of the potentiometer arms occurs in a linear path.

Taking the low frequency range, for example, positioning linear control 10 at one end of its path results in a hinge point (see FIG. 6) of 50 Hz for the sound amplification effect, and positioning it at the other end results in a hinge point of 600 Hz.

Linear control 12 similarly controls the center frequency for selective amplification of the middle frequencies (see FIG. 4). At one end of its path the center point is at 200 Hz. At the other end, the center point is 6 kHz.

Linear control 14 controls the hinge point for high frequencies. At one end of the path the hinge point is set at 2 kHz; at the other end, the hinge point is set at 14 kHz.

The linear controls 10, 12, and 14 are arranged in order, that is, the middle frequency band selection control 12 is located between the low frequency band selection control 10 and the high frequency band selection control 14. Furthermore, the arrangement is such that all three band selection controls 10, 12, and 14 move in the same direction to select bands of higher frequency (and, correspondingly, move in the same direction to select bands of lower frequency).

There is thereby presented an easily comprehensible visual arrangement of the controls 10, 12 and 14 in which band selection for all the frequency ranges is represented by the controls in a progression of frequencies in numerical order.

In the arrangement as shown in FIG. 1, for example, the selection of hinge points or center points in each frequency range has been made at the highest frequency possible in each range, so all the frequency band selection controls 10, 12 and 14 are moved to the far right of their paths.

The three amplitude linear controls 16, 18 and 20 are attached to potentiometers arms 36, 107, and 44, of the low, medium and high frequency amplitude potentiometers 34, 106 and 42, respectively. The potentiometers 16, 18 and 20, are also linear. Each amplitude control is located under the linear control for the frequency range over which it is effective. Low frequency amplitude control 16 is under low frequency band selection control 10, middle frequency amplitude control 18 is under middle frequency band selection control 12, and high frequency amplitude control 20 is under high frequency band selection control 14.

Moreover, the linear amplitude controls 16, 18 and 20 are arranged so that they are perpendicular to the linear frequency band selection controls 10, 12 and 14, respectively. Also, the amplitude controls are arranged so that the same direction of movement of all the controls increases sound amplification (and the same direction decreases it).

In the arrangement as shown in FIG. 1, for example, movement up of linear amplification controls 16, 18 and 20 increases sound amplification; movement down decreases it.

This enhances the visual presentation of the effect of all the linear controls. Linear controls 10, 12 and 14 for frequency band selection move from left to right, in order of the numerical frequency value, both in terms of the arrangement of the three controls themselves and in terms of selecting bands within the frequency ranges.

Linear controls 16, 18 and 20 for amplification move up (to increase amplification) or down (to decrease amplification), and are each located just beneath the frequency range over which they are effective.

The linear controls 10, 12, 14, 16, 18 and 20 are calibrated as shown in FIG. 1. Further, however, the area of the controls (both frequency band selection and amplitude) for each frequency range has a graphic indication of the frequency range controlled. Indicia 150 is a simple graphic representation of amplification effective over low frequencies, showing a hinge point. Indicia 152 is a similar graphic representation of amplification occurring at high frequencies.

A group of indicia 154 show three peaks, indicating bands with center points over which amplification control 14 is effective. The peaks are of varying widths, the narrowest being denominated "Sharp" and the widest at "Broad." The Q selector switch 22, which has the effect of narrowing or widening the bands selected in the middle frequency range, is located just adjacent to this indicia 154 which shows the effect.

All of the elements thus present in the arrangement of the parametric equalizer controls and the indicia appearing near the controls make the use of the controls easy to comprehend and convenient to use.

There has been described novel apparatus and techniques for sound system control that is simple, useful and convenient. It is evident that those skilled in the art may now make numerous uses and modifications of and departures from the specific embodiments described herein without departing from the inventive concepts. Consequently, the invention is to be construed as embracing each and every novel feature and novel combination of features present in or possessed by the apparatus and techniques herein disclosed and limited solely by the spirit and scope of the appended claims.

What is claimed is:

1. In a sound amplification system having a plurality of frequency selective transmission channels with means for controlling the frequency response and gain of each selective transmission channel an improved control panel arrangement comprising, a plurality of substantially contiguous colinear slider frequency response controls each associated with respective frequency contiguous selective transmission channels for controlling the frequency response of a respective channel, and a corresponding plurality of linear slider controls each adjacent and perpendicular to a respective frequency response control for controlling the gain in the channel associated with the adjacent frequency response control.

2. The improvement in accordance with claim 1 wherein end pairs consisting of a frequency response and amplitude control are associated with bass and treble regions of the audio spectrum and the middle pair of controls is associated with the middle range of audio frequencies between said bass and treble ranges.

3. The improvement in accordance with claim 2 and further comprising a Q selector control separated from the middle frequency response control by the middle frequency range gain control for selectively controlling the bandwith of the middle frequency range transmission channel.

4. The improvement in accordance with claim 2 and further comprising simple graphic indicia adjacent to the bass and treble controls representing the amplitude frequency response of low and high pass filters and associated with the middle frequency controls indicating a band pass frequency response.

5. The improvement in accordance with claim 3 and further comprising simple graphic indicia adjacent to the bass and treble controls representing the amplitude frequency response of low and high pass filters and associated with the middle frequency controls indicating a bandpass frequency response, there being simple graphic indicia at end and intermediate positions of said Q selector control to indicate broad, intermediate and narrow bandwidths for respective positions of said Q control.

* * * * *